United States Patent [19]

Asazawa et al.

[11] Patent Number: 4,749,877
[45] Date of Patent: Jun. 7, 1988

[54] BIAS CIRCUIT FOR AN FET

[75] Inventors: Hiroshi Asazawa; Kazuya Hashimoto, both of Tokyo, Japan

[73] Assignee: NEC Corporation, Japan

[21] Appl. No.: 895,147

[22] Filed: Aug. 11, 1986

[30] Foreign Application Priority Data

Aug. 13, 1985 [JP] Japan ................... 60-178943

[51] Int. Cl.⁴ .................. H03K 3/01; G05B 24/02
[52] U.S. Cl. .................. 307/296 R; 307/304; 323/354
[58] Field of Search ............. 307/296 R, 297, 304, 307/570, 317 R; 323/353-354

[56] References Cited
FOREIGN PATENT DOCUMENTS
0067550 6/1977 Japan .............. 307/296 R OTHER PUBLICATIONS
"FET Ground Plus Bias Circuit", IBM Tech. Disc., vol. 27, No. 12, May 1985.

Primary Examiner—John S. Heyman
Assistant Examiner—M. R. Wambach
Attorney, Agent, or Firm—Laff, Whitesel, Conte & Saret

[57] ABSTRACT

A bias circuit for an FET comprises a voltage divider having two potential points. A first of the potential points is connected to a gate of the FET. The other potential point is connected through a second FET which may be turned off or on to vary the potential at the first potential point in order to control the bias on the gate of the first FET. The switching of the second FET is controlled as a function of a threshold voltage between its gate and a voltage in the source-drain circuit of the second FET. In one embodiment, a diode feedback circuit may be used to provide the threshold current.

15 Claims, 2 Drawing Sheets

1ST EMBODIMENT

1ST EMBODIMENT

2ND EMBODIMENT

3RD EMBODIMENT

4TH EMBODIMENT

BIAS CIRCUIT FOR AN FET

BACKGROUND OF THE INVENTION

The present invention relates to a bias circuit for a transistor and, more particularly, to a bias circuit which has means for compensating for deviations in the threshold voltage of a field effect transistor (FET).

A prior art bias circuit for an FET comprises a voltage dividing resistor which applies a gate bias to the FET. The problem with this type of bias circuit is that the voltage dividing resistor does not compensate for a deviation of the threshold voltage $V_T$ of the FET.

Another prior art bias circuit for an FET is disclosed in the paper entitled "Broadband GaAs Monolithic Amplifier" and presented by Onoda et al at the 1984 National Meeting of the Institute of Electronics and Communication Engineers of Japan, April 1984. The bias circuit proposed by Onoda et al is constructed to shift the operating point of an FET by a use of a negative feedback circuit so that a deviation of the threshold value $V_T$ may be compensated for. However, the compensation attainable with such a bias circuit is not satisfactory.

SUMMARY OF THE INVENTION

It is therefore an object of the present invention to provide a new bias circuit which confines errors in operating current to a narrow range over a wide range of threshold voltages $V_T$ and which is feasible for installation in an integrated circuit.

In accordance with the present invention, a bias circuit has a resistor connected between two power supply terminals for supplying a voltage appearing at a first division point of the resistor to a first FET as a gate bias. A second division point is provided on the resistor; and a second FET has a drain or a source thereof connected to the second division print. A gate voltage of the second FET is connected to a predetermined potential point.

BRIEF DESCRIPTION OF THE DRAWINGS

The above and other objects, features and advantages of the present invention will become more apparent from the following detailed description taken with the accompanying drawings in which.

DESCRIPTION OF THE INVENTION

Figure 7:
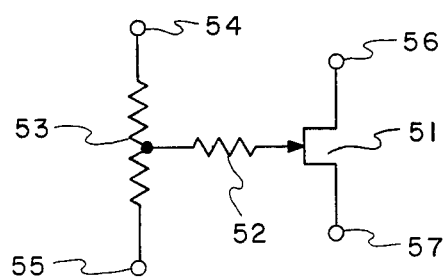
FIG. 7 is a schematic diagram of the prior art bias circuit for an FET.

To better understand the present invention, a brief reference will be made to a prior art bias circuit for an FET, shown in FIG. 7. As shown, a resistor 53 is connected to power supply terminals 54 and 55 and supplies a bias voltage to a gate of an FET 51, via a resistor 52. As previously stated, this kind of arrangement is disadvantageous because the bias voltage, or voltage divided by the resistor 53, is constant. Any deviation in the threshold voltage $V_T$ of the FET results in a deviation in the operating point of the FET. In FIG. 7, the reference numerals 56 and 57 respectively designate power supply terminals for the FET 51.

Figure 1:
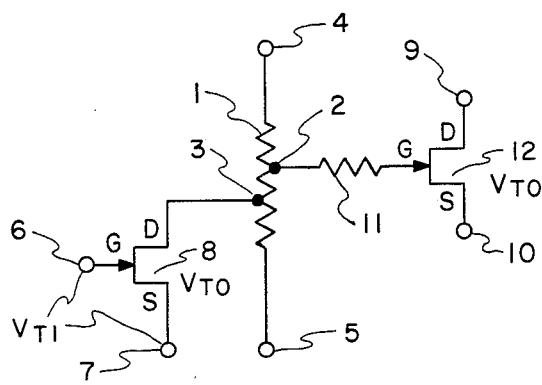
FIGS. 1 to 4 are schematic diagrams respectively showing a first to a fourth embodiments of a bias circuit for an FET in accordance with the present invention.

FIG. 1 shows a first embodiment of the bias circuit in accordance with the present invention. An FET 12 is shown as having a drain and a source connected to power supply terminals 9 and 10, respectively. A gate is connected to one end of a resistor 11. Those elements which are designated by the reference numerals 1 to 8 constitute the bias circuit which biases the FET 12. Specifically, a resistor 1 is connected to power supply terminals 4 and 5 and is divided at a point of division 2 so that a gate bias is applied to the FET 12, via the resistor 11. So far as such a system is concerned, this embodiment is the same as the prior art bias circuit of FIG. 7. A characteristic feature of this particular embodiment is an second FET 8 which has a drain connected to another point of division 3 of the resistor 1, and a gate and a source connected to power supply terminals 6 and 7, respectively. It is important to note that the FET 8 is different in size from the FET 12, but is fabricated at the same process step as the FET 12, and is equal in threshold voltage $V_T$ to the FET 12.

Figure 2:
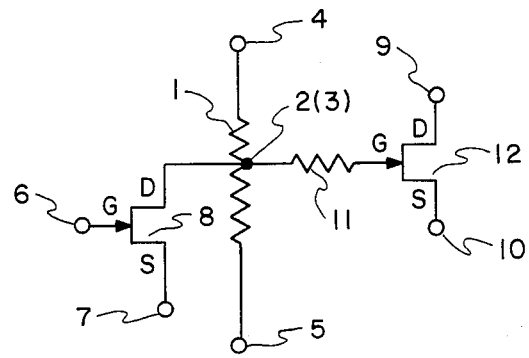
Figure 3:
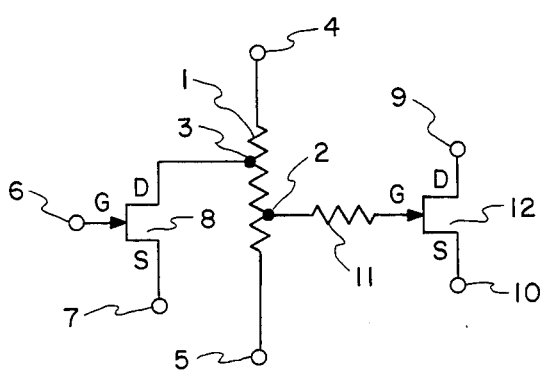

The division points 2 and 3 of the resistor 1 may have any of three different relative positions, i.e., a first position in FIG. 1 wherein the division point 2 has a higher potential than the division point 3. In FIG. 2, the division points 2 and 3 are at a second position where they have the same potential. At a third position in FIG. 3 the division point 3 has a higher potential than the division point 2. The division point 2 is determined by potentials at the power supply terminals 4, 5 and 10 and by a predetermined voltage applied across the gate and source of the FET 12. However, the division point 3 is open to choice so long as it remains at a potential which is higher that the potential of the power supply terminal 7 and ensures a voltage across the drain and source of the FET 8. These are the reasons which account for the three alternative connections as shown in FIGS. 1 to 3.

Because all of the three connections share the same operation principle, the following description will concentrate on the connection of FIG. 1 by way of example.

In FIG. 1, the gate bias voltage of FET 8 can be set to a voltage $V_{T1}(=V6-V7)$, which is representative of the voltage across the power supply terminals 6 and 7. Assuming that the designed threshold voltage of the FETs 8 and 12 is $V_{T0}$, the following relationship is set up:

$$V_{T1} < V_{T0} < 0$$

When the threshold value $V_T$ of a manufactured FET is greater than the gate bias voltage $V_{T1}$, the FET 8 remains turned off so that the voltage at the terminal 2 is equal to the divided voltage. As the threshold value $V_T$ becomes equal to or smaller than the gate bias voltage $V_{T1}$, the FET 8 is turned on to cause a current to flow with the result that the voltage at the terminal 3 is lowered due to the resultant voltage drop. This lowers the voltage at the terminal (division point) 2 which is applied to the gate of the FET 12. Further, when the threshold value $V_T$ is equal to or smaller than the gate bias voltage $V_{T1}$ and when the the threshold value $V_{T1}$ is smaller than the threshold value $V_{T0}$, the FET current $I_{DS}$ becomes greater than the comparable current with the threshold value $V_{T0}$. But, the voltage at the terminal (division point) 2 is lowered to shift the current $I_{DS}$ to a lower side. Therefore, the degree of any deviation of the current can be reduced, as compared to the deviation in a prior art system of FIG. 7.

Figure 5:
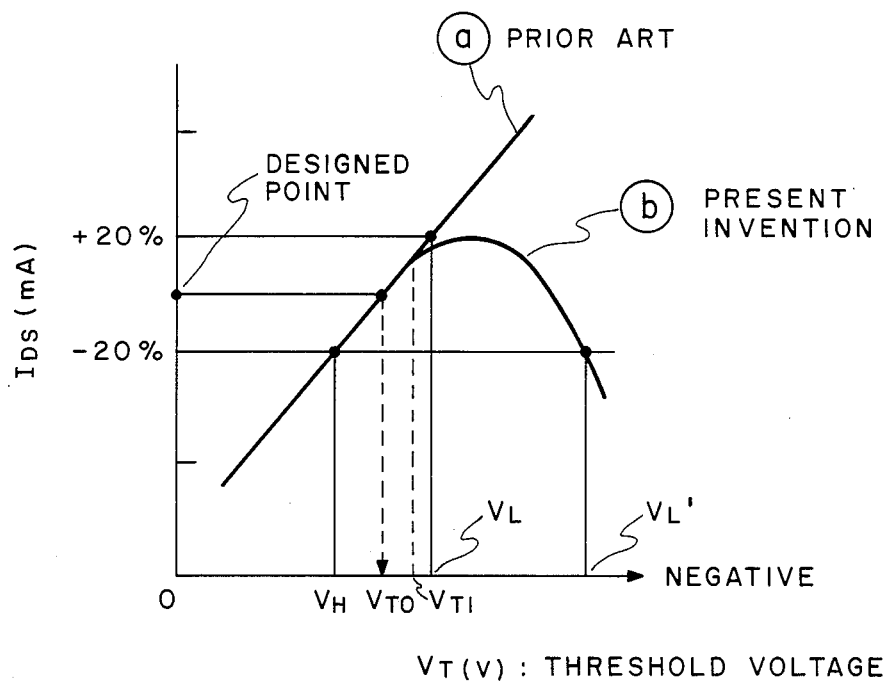
FIGS. 5 and 6 are graphs showing characteristics of a bias circuit of the present invention together with the characteristics of a prior art circuit which is shown in FIG. 7.
Figure 6:
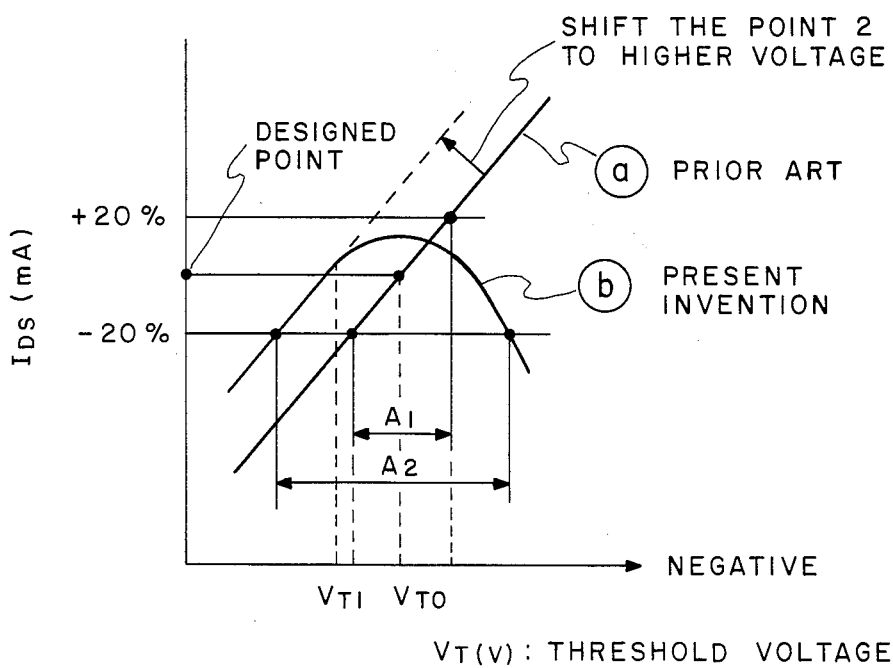

By adequately selecting the size of the FET 8, it is possible to provide a bias circuit which compensates for a deviation of the threshold voltage $V_T$, as represented by a graph of FIG. 5. In FIG. 5, the abscissa is indicative of threshold voltages $V_T$ of the FETs 8 and 12. The ordinate indicates, the drain-source current $I_{DS}$ of the FET 12. Assume that the allowable range of current values is ±20 percent. The range of threshold voltages $V_T$ which is attainable with the prior art circuit of FIG. 7 is limited to $V_L < T_T < V_H$ as represented by a characteristic ⓐ. The present invention has a threshold voltage range which is as wide as $V_L' < V_T < V_H$ as represented by a characteristic ⓑ. Further, in the circuit of FIG. 1, if $V_{T1}$ is greater than $V_{T0}$ and if the potential of the division point 2 is higher than the potential of FIG. 7, the maximum value can be shifted to the vicinity of $V_T \approx V_{T0}$ as represented by a characteristic ⓑ of FIG. 6, so that a bias circuit which compensates for the threshold voltage deviation in both of the cases of $V_T < V_{T0}$ and $V_T < V_{T0}$ is achievable. That is, the allowable range of the $V_T$ deviation is extended from $A_1$ to $A_2$, as shown FIG. 6.

Figure 4:
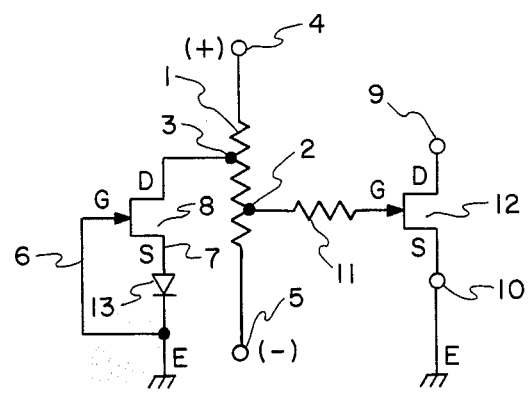

FIG. 4 shows a more specific embodiment of the present invention. The bias circuit of FIG. 4 is applicable to an FET having a threshold voltage $V_T$ which is nearly equal to $-1$ volt. As shown, the bias circuit includes a positive power supply terminal 4, a negative power supply terminal 5 and a ground terminal E. The bias circuit is constructed such that when the threshold voltage $V_T$ of the FET 12 has been lowered beyond the order of $-0.7$ volt, a diode 13 turns on the FET 8. The operation principle of this embodiment is the same as that of FIG. 1.

In summary, it will be seen that in accordance with the present invention can extra FET is adapted to compensate for deviations of threshold voltage $V_T$. The extra FET is added to an ordinary resistance-division type bias circuit, so that errors of the operating current of an FET are confined in a narrow range over a wide range, while this FET is operating of threshold values $V_T$ of the manufactured FET. In addition, the bias circuit of the present invention can be fabricated at the same process step as an FET and a resistor. Hence, it is optimum not only as a bias circuit of a single FET but also as a bias circuit which is to be built in an integrated circuit chip.

What is claimed is:

1. A bias circuit having a resistor connected between two power supply terminals, means for supplying a voltage appearing at a first division point on said resistor to a first FET at a gate bias, the drain and source of said first FET being coupled to third and fourth power supply terminals, respectively, said circuit comprising:
   a second division point which is provided on said resistor; and
   a second FET having the drain thereof connected to said second division point, different from said first division point, the gate and source of said second FET being connected to first and second predetermined potential points, respectively, said first and second FETs being fabricated by a same process so that said first and second FETs have a same threshold voltage whereby the allowable range of the threshold value of said bias circuit is extended.

2. A bias circuit for a first FET having a drain and source coupled to first and second predetermined potential points, respectively, said circuit comprising:
   a resistor connected between two power supply terminals and having a first division point which is connected to the gate of said first FET; and
   a second FET having a drain connected to a second division point, different from said first division point, of said resistor and a gate and source connected to third and fourth predetermined potential points, respectively, said first and second FETs being fabricated by a same process so that said first and second FETs have a same threshold voltage whereby the allowable range of the threshold value of said bias circuit is extended.

3. A bias circuit as claimed in claim 2, wherein potentials at said first and second division points are different from each other.

4. A bias circuit as claimed in claim 3, wherein the potential at said first division point is higher than the potential at said second division point.

5. A bias circuit as claimed in claim 3, wherein the potential at said first division point is lower than the potential at said second division point.

6. A bias circuit as claimed in claim 2, wherein potentials at said first and second division points are equal to each other.

7. A bias circuit as claimed in claim 2, wherein said third predetermined potential point is a ground potential, said bias circuit further comprising a diode which has an anode connected to the source of said second FET and a cathode connected to said ground potential.

8. A bias circuit as claimed in claim 2, further comprising a gate resistor connected between said first division point and the gate of said first FET.

9. A method of controlling an operating current of a first FET, comprising the steps of:
   taking a bias voltage from a first division point on a resistor which is connected between first and second power supply terminals;
   applying said bias voltage to the gate of said first FET;
   coupling the drain and source of said first FET to third and fourth power supply terminals, respectively;
   connecting the drain of a second FET to a second division point, different from said first division point, on said resistor, said first and second FETs being fabricated by a same process so that said first and second FETs have a same threshold voltage whereby the allowable range of the threshold valve of said bias circuit is extended; and
   connecting the gate and source of said second FET to first and second predetermined potentials, respectively.

10. A bias circuit for a first FET comprising a voltage dividing means coupled between first and second power source terminals, means for coupling a first potential point of said voltage dividing means to a control electrode on said first FET, said first FET having two electrodes coupled to third and fourth power source terminals, respectively, and a desired bias potential point; and
    a second FET having two electrodes coupled to a second potential point, different from said first division point, of said voltage dividing means a first particular potential point, respectively, and a control electrode coupled to a second particular potential point, said first and second FETs having at least one electrical characteristic which is substantially the same, whereby the effects produced by said one characteristic in said first and second FETs may cancel each other and whereby the allowable range of the threshold value of said bias circuit is extended.

11. The bias circuit of claim 10 wherein said first and said desired bias potential points are at the same potential.

12. The bias circuit of claim 10 wherein said first potential point is at a positive potential relative to said desired bias potential point.

13. The bias circuit of claim 10 wherein said first potential point is at a negative potential relative to said desired bias potential point.

14. The bias circuit of claim 9 wherein said bias circuit, and first FET are parts of an integrated circuit, and the parts relating to said one characteristic are formed at the same step in the process for manufacturing the integrated circuit, thereby giving said parts substantially identical characteristic.

15. The bias circuit of claim 10 wherein said second FET has a diode coupled between its control and one of its two electrodes in order to give a predetermined bias voltage to said second FET.

* * * * *